United States Patent [19]
Gergin

[11] Patent Number: 4,835,465
[45] Date of Patent: * May 30, 1989

[54] TESTING APPARATUS FOR PLATED THROUGH-HOLES ON PRINTED CIRCUIT BOARDS, AND PROBE THEREFOR

[75] Inventor: Emile Gergin, New York, N.Y.

[73] Assignee: GEO International, Stamford, Conn.

[*] Notice: The portion of the term of this patent subsequent to Jun. 23, 2004 has been disclaimed.

[21] Appl. No.: 113,389

[22] Filed: Oct. 22, 1987

Related U.S. Application Data

[63] Continuation of Ser. No. 941,298, Dec. 12, 1986, abandoned, which is a continuation of Ser. No. 611,140, May 17, 1984, Pat. No. 4,675,600.

[51] Int. Cl.$^4$ .............. G01R 1/04; G01R 1/067
[52] U.S. Cl. .............. 321/158 F; 324/158 P; 324/62; 324/72.5
[58] Field of Search .............. 324/525, 537, 62, 65 P, 324/158 P, 158 F, 73 PC, 149, 72.5, 64

[56] References Cited

U.S. PATENT DOCUMENTS

| | | | |
|---|---|---|---|
| 3,466,539 | 9/1969 | Pitts et al. | 324/72.5 |
| 3,885,215 | 5/1975 | Weindtock | 324/158 P |
| 3,893,233 | 7/1975 | Glover | 29/877 |
| 4,175,253 | 11/1979 | Pitegoff | 324/62 |
| 4,471,298 | 9/1984 | Frohlech | 324/73 PC |

FOREIGN PATENT DOCUMENTS

| | | | |
|---|---|---|---|
| 0647899 | 2/1979 | U.S.S.R. | 324/73 PC |
| 1244572 | 9/1971 | United Kingdom. | |

OTHER PUBLICATIONS

"Simultaneous Continuity and Shorts Testing", by Thorsdale, IBM Tech. Disc. Bull., vol. 1, #8, 1/68.

Primary Examiner—Reinhard J. Eisenzopf
Assistant Examiner—W. Burns
Attorney, Agent, or Firm—Curtis, Morris & Safford

[57] ABSTRACT

A testing device for testing the quality of through-hole plating of a printed circuit board employs probes having pyramidical tips, with the edges of the probe tips contacting the ends of the through-hole plating. The probe edges are insulated from each other, so that the device can easily carry out Kelvin four-point testing. Because contact is needed only at the probe edges, lighter force can be applied to the probes, and plating damage can be avoided. The device also is constructed to avoid interference from stray varying magnetic fields. This is done by keeping the area of a voltage loop between the probes as small as possible, by use of ferromagnetic members to divert stray fields to the outside of the loop, and by use of a dual-slope integrating digital to analog converter.

5 Claims, 5 Drawing Sheets

TESTING APPARATUS FOR PLATED THROUGH-HOLES ON PRINTED CIRCUIT BOARDS, AND PROBE THEREFOR

This application is a continuation of application Ser. No. 06/941,298, filed Dec. 12, 1986, now abandoned, which is a continuation of application Ser. No. 06/611,140, filed May 17, 1984, now U.S. Pat. No. 4,675,600.

The present invention relates to the quality testing of electrical printed circuit boards, and more particularly to the testing of the quality of the coating or plating layer applied to through-holes in printed circuit boards. More specifically, this invention relates to improved testing apparatus for measuring the consistency of conductance (or resistance) of through-hole plating in printed circuit boards.

A number of non-destructive testing techniques have been previously proposed for checking the quality of plating on printed circuit board through holes.

In one such previously-proposed technique, beta ray radiation is caused to impinge upon the metallic through-hole coating, and the backscatter is measured. While this beta ray backscatter measuring technique has been used extensively for measuring plating thickness, it cannot accurately detect cracks, voids, or other defects in the plating.

More recently, attempts have been made to test the through-hole plating integrity and thickness by forcing a current into the through-hole plating from one side of the printed circuit board to the other, and then measuring the voltage drop across the through-hole plating. Because of problems encountered if the same electrode is used both to apply current to the plating and also to measure the voltage drop, the Kelvin or four-point testing technique has been developed. This technique is discussed, for example, in British patent specification No. 1,244,572. In this technique, a source of current is connected to two electrodes, each of which is held in contact with the metal at opposite ends of the hole. Then, the voltage drop between the two ends of the hole is measured by a separate pair of electrodes, and these electrodes are coupled to sensitive measuring device, such as a VTVM.

In order to ensure good contact of the current-launching electrodes and the voltage-testing electrodes with the metal plating, the probes that have been previously proposed have preferably been constructed to have tapered conical end portions, i.e. members of circular cross-section. In one version, these probe end portions are split into two 180° sections isolated from one another, with one section constituting the current-launching electrode and the other constituting the voltage-measuring electrode. In another previously proposed version, the probe's tapered end portion has a large current-launching electrode constituting about 350° or more of the entire circular cross-section, with a narrow section, of about 10°, constituting the voltage-measuring electrode.

In the techniques previously proposed that employ such probes, the probes must be pressed into the holes with substantial force to ensure even current distribution. The high force applied to the conic probe flares out the ends of the through-hole plating. Also, the high forces required to establish even current distribution can damage the plating, and can even damage the substrate of the circuit board itself.

Moreover, because there is only one voltage measuring electrode provided, and that on only one side of the probe, it is impossible to detect unevenness or variations from one part of the through-hole plating to another.

Furthermore, the low resistance value of a typical through-hole plating makes it difficult to measure that resistance value. That is, if a low current is applied to the through-hole plating, the voltage drop across it will be on the order of only a few microvolts. In order to ensure a good reading, it has been necessary to apply very high currents, and high currents tend to heat the through-hole plating. Of course, the heating of the through-hole plating changes the resistance of the material, introducing errors in measurement. To make matters worse, the leads coupling the probes on the two sides of the printed circuit board form a loop, and this loop can pick up stray varying magnetic fields, for example, the 60 Hz field associated with line current. Because the voltage drop across the through-hole is so small, unless excessive currents are applied, the voltage generated in the loop by the stray fields can dominate the voltage drop across the through-hole; consequently, in previous arrangements elaborate circuitry had to be incorporated to compensate for stray fields.

Accordingly, it is an object of this invention to provide improved testing apparatus, and an improved probe therefor, to avoid the problems encountered with the devices of the prior art.

It is another object of this invention to provide a probe which permits testing of through-hole plating without danger of damage to the plating.

It is another object of this invention to provide such a probe which permits multiple measurements to be made on the same through-hole plating.

It is yet another object of this invention to provide testing apparatus constructed such that low currents, on the order of a fraction of an ampere, can be used for through-hole plating testing and also structured to keep to a minimum stray voltages generated in the voltage-sensing loop.

In accordance with an aspect of this invention, the electrical probe is constructed with a shaft portion and a conductive point portion. The point portion has a generally pyramidical shape, such that it includes at least three sloping edges that extend from the shaft portion towards an apex of the point portion. Insulating layers are interposed between successive ones of the sloping edges, so that the edges are electrically isolated from one another. In a preferred embodiment, the probe is constructed from three elongated conductive members, each having a shaft portion and a pointed end portion. The end portion of each member has two bevelled faces meeting at a sloping edge, with the sloping edge extending towards an apex of the probe. The conductive members are joined, by an insulating layer, with their shaft portions aligned and with their apices substantially coincident so that the bevelled faces define the generally pyramidical probe point.

According to another aspect of this invention, testing apparatus are constructed for measurement of conductivity of the conductive through-hole plating, and include first and second probes constructed according to the general principles of this invention. Current means apply a current through a first selected one of the edges of the first probe, through the conductive plating, and then into a first selected one of the edges of the second probe, and also measures the current applied by the current means across the conductive plating, giving a corresponding current output value. Voltage means coupled to a second selected one of the edges of each of the first and second probes senses a voltage difference between them, and provides a voltage value corresponding to that voltage difference. An electromechanical arrangement, preferably solenoid actuated, brings the first and second probes into contact with the plating of a selected through-hole on the workpiece printed circuit board. Appropriate electronic circuitry, such as an analog-to-digital converter coupled to a computer, receives the current value and the voltage value and produces a quality measurement for the plating of the selected through-hole.

Considered from another aspect, testing apparatus of this invention comprise means for making electrically conductive contact with the opposed peripheries of the through-hole plating at least at first and second points at each periphery; means for applying an electric current between one of the first and second points on the one periphery and one of the first and second points on the other periphery; means for sensing a voltage difference between another of the at least first and second points on the one periphery and another of the at least first and second points on the other periphery and adapted to provide a signal representative of the voltage to a computer or other suitable device that can produce a plating quality measurement; and means for sensing the current that is applied to the through-hole plating and adapted to provide a signal representative of the current to the device that produces the quality measurement. The points among the at least first and second points to which the current is applied and from which the voltage is sensed can be chosen by use of a suitable selecting means, e.g., a bank of VMOS switching transistors or an integrated circuit analog switch.

From another aspect of the invention, testing apparatus are provided including means for applying an electric current through at least a portion of the through-hole plating means for sensing the voltage between at least two pairs of loci of the plating, and means for producing signals representative of the applied current and of the voltage. The current is favorably applied through a third pair of loci of the plating. In the embodiment described below, the edges of the tips or points of the upper and lower probes make what is substantially point contact with the through-hole plating, with each edge defining a locus where it contacts its respective periphery of the plating.

The conductors that connect the two probes with the voltage means define a loop within the housing for the apparatus, and in order to prevent errors from stray varying magnetic fields, means are also included to cause stray flux from such stray fields to avoid this loop. One way that this is done is to make the area of the loop as small as possible, by running the conductors through ducts disposed in close proximity to a separation of the housing, between the upper and lower probes, that accommodates the thickness of the printed circuit board. Another way that this is done is by using for these ducts channel members formed of ferromagnetic material and arranged to conduct magnetic flux over the outside of the loop. Also, a dual-slope integrating analog-digital converter is employed. The three of these features, taken together, permit accurate voltage measurements to be taken even when the probe current is as low as 200 milliamps.

The above, and many other objects, features and advantages of this invention, will be more completely understood from the ensuing detailed description of a preferred embodiment, which description is to be considered in connection with the accompanying drawings, in which:

FIGS. 4 and 5 are perspective views respectively showing upper and lower front plate assemblies of the embodiment of FIG. 1;

Figure 1:
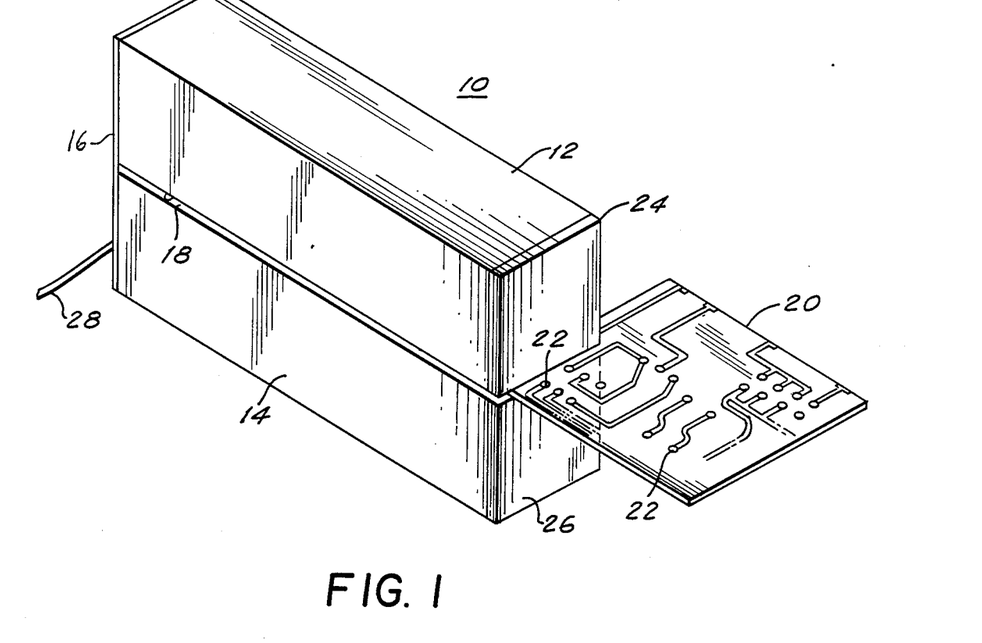
FIG. 1 is a perspective view of a through-hole plating test apparatus assembly, according to an embodiment of this invention.
Figure 2:
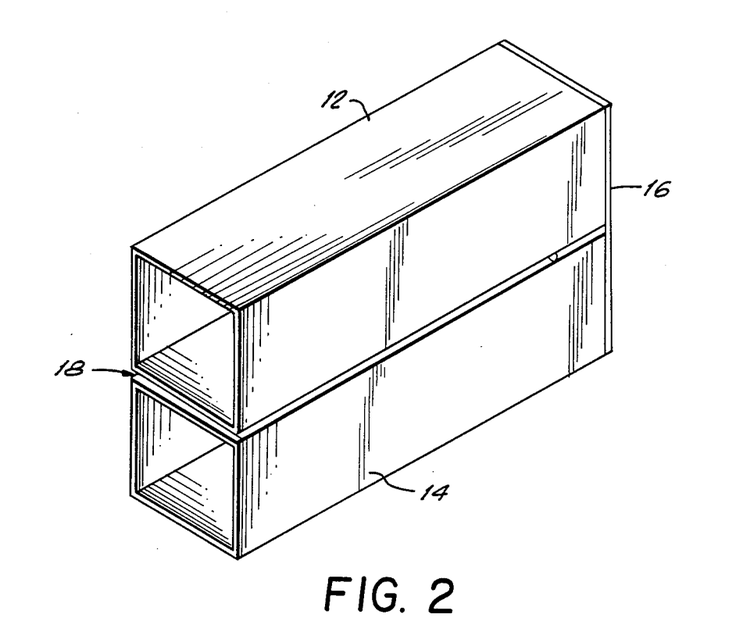
FIG. 2 is a perspective view of a housing of the embodiment of FIG. 1.
Figure 3:
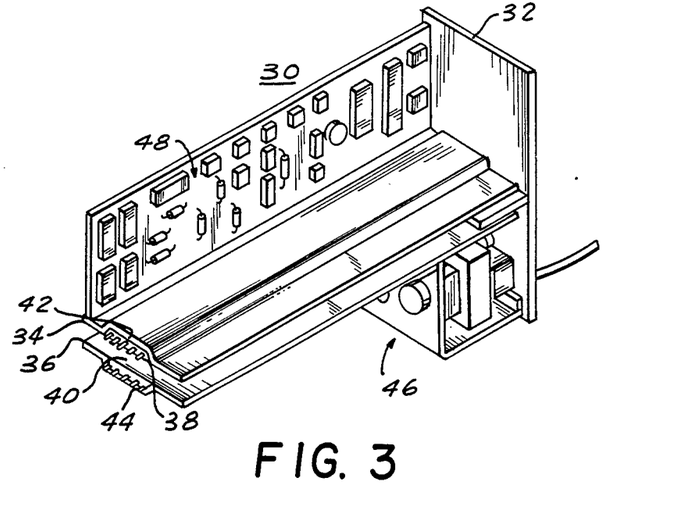
FIG. 3 ia a perspective view showing the chassis and inner assembly of the embodiment of FIG. 1.

With reference to the drawings, and initially to FIGS. 1–3 thereof, a through-hole test assembly 10 according to this invention is disposed in the casing formed of an upper housing 12 and a lower housing 14 joined by a back plate 16 to form a generally U-shaped configuration with a slot or separation 18 disposed between the upper and lower housings 12 and 14. The separation 18 is dimensioned to provide sufficient clearance for the thickness of a printed circuit board workpiece 20, which is shown in FIG. 1 to have plated through-holes 22 formed thereon.

As shown in FIG. 2, the upper and lower housing members 12 and 14 are preferably hollow aluminum members of rectangular cross-section.

Also shown in FIG. 1 are an upper front plate 24 and a lower front plate 26, described in more detail later with reference to FIGS. 4 and 5, respectively. A power/control cord 28 is shown extending from the rear of the apparatus 10. The cord 28 has various conductors therein, coupling to a power source, a data processing device, such as a general purpose personal computer, and a control pedal or other device for controlling the raising and lowering of the probes. The devices coupled to the control cord 28 can be of any suitable conventional design, and are not shown.

As shown in FIG. 3, an inner assembly 30 designed to fit into the housing 12 and 14 has a rear plate 32 joined to rear ends of an upper channel member 34 and a lower channel member 36, these channel members being formed of a ferromagnetic material with the channels thereof facing one another. An upper cable run 38 is disposed in the channel of the upper channel member 34, and a lower cable run 40 is disposed in the channel of the lower channel member 36. These cable runs 38 and 40 include conductors and leads for the probes, solenoids, lamps, and other members on the upper and lower plates 24 and 26. Multi-pin sockets 42 and 44 are employed as plug assemblies at the ends of the channel members 34 and 36.

Also shown are a power supply 46 disposed beneath the lower channel member 36, and electronics circuitry 48 (shown in more detail in FIG. 11) on a board mounted on the upper channel 34.

The power supply 46 provides DC power of various levels, such as plus or minus 5 volts and plus or minus 15 volts.

Figure 4:
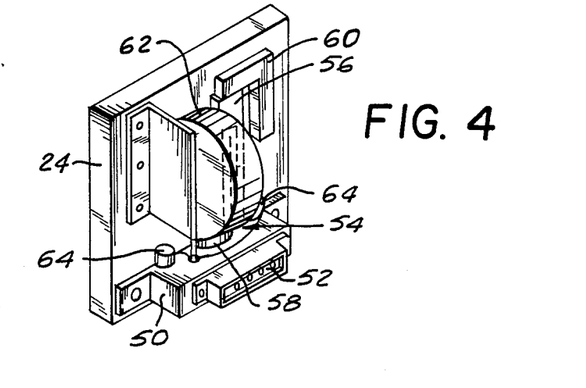

The upper front plate 24 shown in FIG. 4 includes a block 50 mounted on the interior side of the plate 24 and holding a multi-pin jack 52. The jack 52 couples to the socket 42 when the front plate 24 is assembled onto the chassis or inner assembly 30. A probe 54 (obscured in this view) is mounted on a probe drive shaft 56 for slidable vertical movement with respect to the front plate 24. The probe 54 extends downward through an opening 58 in the block 50, and the upward motion of the shaft 56 is limited by a stop member 60. A rotary solenoid 62 coupled to the shaft 56 moves the latter for lowering and raising the probe 54. Also shown are lamp assemblies 64, disposed in the block 50 on either side of the probe 54. These illuminate the workpiece printed circuit board 20 and help to locate the plated through-hole 22 to be tested. While not specifically identified, various leads are shown which extend from the jack 52 to the various elements 54, 62, 64 on the upper front plate 24.

Figure 5:
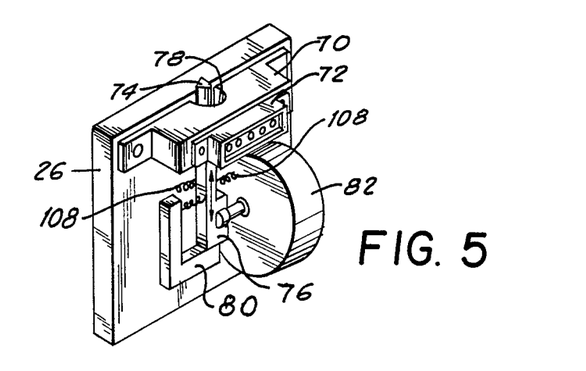

The lower front plate 26 is shown in detail in FIG. 5, and can be generally described as an inverted version of the upper front plate 24; however, in the lower plate 24 the lamp assembly 64 has been omitted. This front plate assembly includes a block 70 having thereon a multi-pin jack 72, and a probe 74 mounted on a probe drive shaft 76 and extending upwards through an opening 78 in the block 70. A stop 80 limits the downward travel of the shaft 76, and a rotary solenoid 82 is provided for inducing movement of the shaft 76 and probe 74. When the lower front plate 26 is assembled onto the chassis or inner assembly 30, the multi-pin jack 72 fits onto the socket 44.

The tip or point of the lower probe 74 is shown to be generally pyramidical in shape, that is, the probe tip has a triangular cross-section. Thus, the lower probe 74 will contact the through-hole plating 22 at three points, as will the upper probe 54.

Figure 6:
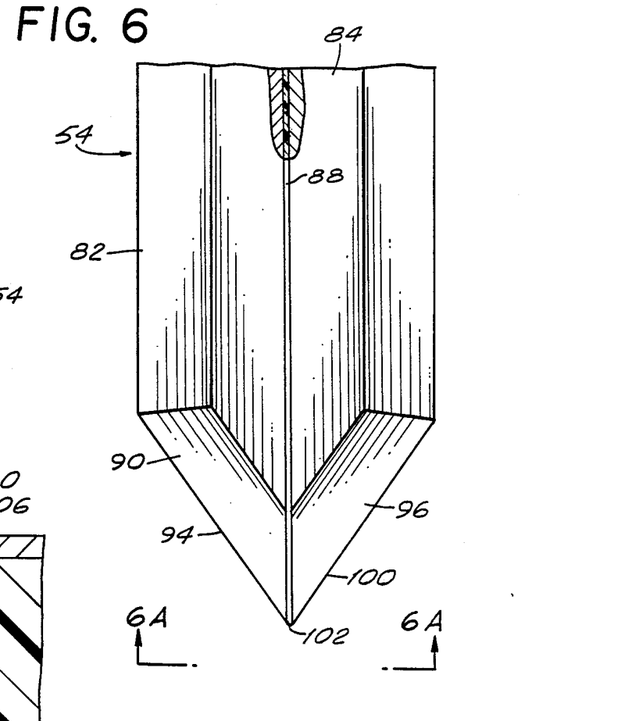
FIGS. 6, 6A, and 7 illustrate probes constructed according to this invention.
Figure 6A:
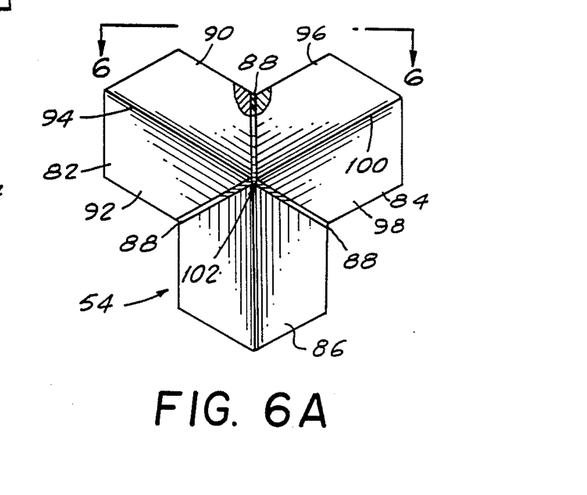

The construction of the probes 54 and 74 according to the preferred embodiment is illustrated generally in FIGS. 6 and 6A.

As shown in these two views, the probes 54 and 74 of this particular embodiment are constructed of three pieces of steel hex stock; the upper probe 54, being typical, is constructed of three hexagonal longitudinal members 82, 84, and 86, each occupying substantially 120° of arc. These are joined by an insulating layer 88, which serves also to separate and isolate the three elements 82, 84, 86 from one another. The members 82, 84, 86 are each ground so that they have a pair of bevelled faces, and the faces together define a slanting or sloping edge. More specifically, the member 82 has a pair of bevelled faces 90 and 92 defining a sloping edge 94, while the member 84 has a pair of bevelled faces 96 and 98 defining a sloping edge 100. The other member 86, which is obscured in FIG. 6, is of substantially identical construction.

These members 82, 84, 86 have their sloping edges extending to an apex 102 which is common for all three members 82, 84, 86. The sloping edges should be rounded to avoid damaging the workpiece.

It should understood that the adjacent faces of adjacent members, for example, faces 90 and 96 of the members 82 and 84, respectively, will lie substantially in the same plane, so that the bevelled faces together form a generally pyramidical tip for the probe 54.

While hex stock is favorably used in this embodiment to construct a three-edge probe, members of other cross-sectional shape can be used, while maintaining the three-edge, three-face pyramidical structure. Also, the invention is not limited to three-edge probe configurations. For example, square stock could be employed if a probe having four sides and four edges were needed, or appropriately shaped stock could be employed if a five-sided (pentagonal) or other construction were desired. Nevertheless, a three-edge configuration is preferred to ensure that all edges will contact the through-hole plating, even if the through-hole is eccentric or out of round.

Figures 7, 9:
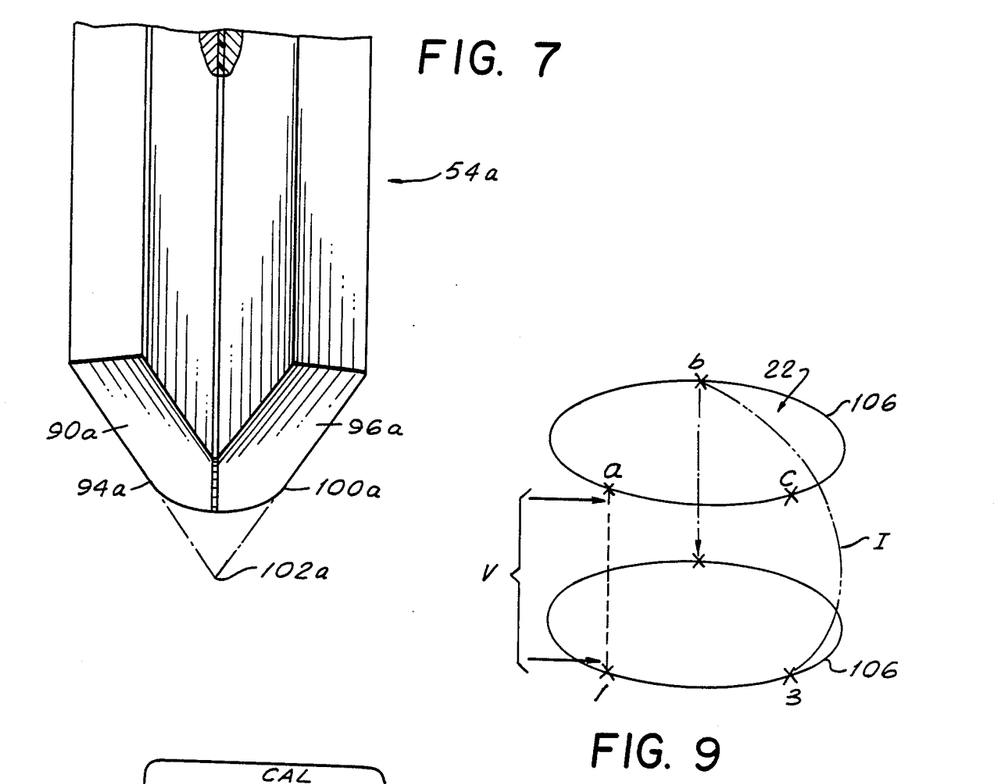
FIG. 9 is a schematic illustration of a test operation conducted with the probes of this invention.

Alternatively, the probe can be blunted or truncated, as shown in FIG. 7, without departing from the principles of this invention. FIG. 7 illustrates a blunt-nosed probe 54a, which is generally similar to that shown in FIG. 6, and elements that correspond to elements in FIG. 6 are identified by the same reference numbers, followed by the letter a. Such a construction, as illustrated in FIG. 7, would be useful for printed circuit boards where the widths of the through-holes 22 are greater than the thickness of the printed circuit board 20. The truncated pyramid construction would prevent the tips of the opposed upper and lower probes from touching one another. More specifically, in FIG. 7, a probe 54a having a truncated or blunted point has bevelled faces, for example, 90a and 96a, etc., which define sloping edges 94a, 100a, etc. These edges, if extended, would reach an apex 102a located in line with the center of the probe 54a.

Figure 8:
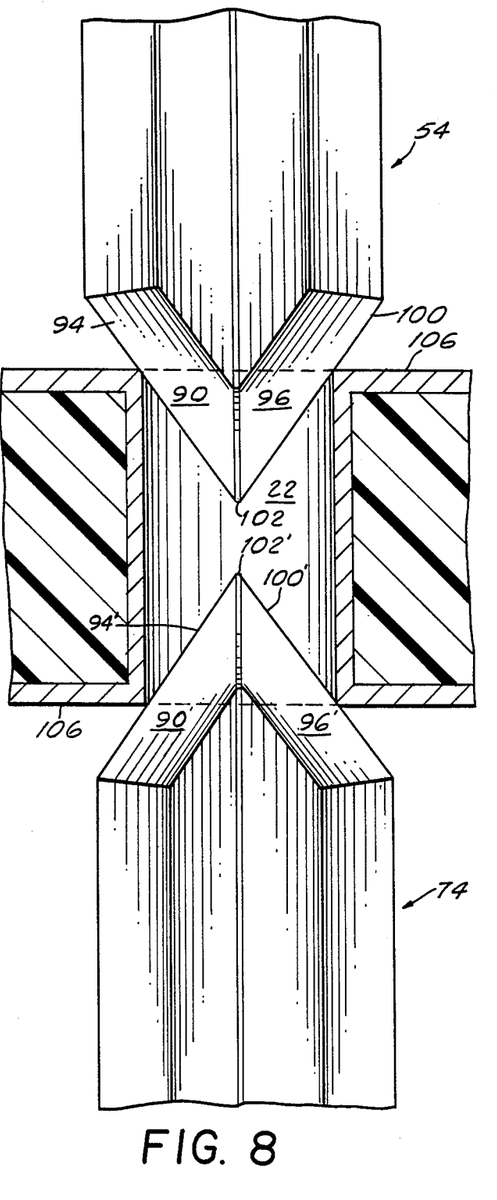
FIG. 8 shows the probes of this invention in connection with the testing of through-hole plating in a printed circuit board.

Shown in FIG. 8 are the upper probe and lower probe 54 and 74 as used in the testing of plating 106 of a particular printed circuit board through-hole 22. Here, the lower probe 74 has elements identified with the same reference numbers as those of the upper probe 54, except primed. The probes 54 and 74 each contact the plating 106 at three points. That is, the probes 54 and 74 contact the plating 106 at, and only at, the three edges, to wit, at the edges 94, 100 and at a third edge obscured in the drawing, and at the edges 94', 100' and at a third (obscured) edge, respectively.

To ensure accurate placement of the probes 54, 74 into the ends of the through-hole 22, even if the latter is somewhat irregular or unevenly formed in the board 20, both of the probes 54 and 74 have at least a small amount of play in the horizontal directions, i.e., in the plane of the board 20. This makes the probes 54, 74 somewhat self-adjusting. In the preferred embodiment (see FIG. 5), the lower probe shaft 76 and the upper probe shaft 56 are loosely mounted, and centered by means of four weak springs 108. The latter ensure that the play in the mounting of the probe shafts 56 and 76 will not result in the probes missing the through-hole 22 since the springs align the center lines of the probes.

In operation, the upper solenoid 62 is actuated first, bringing the probe 54 downward. This clamps the board 20 against the top of the lower housing 14. Because the upper probe shaft 56 has little horizontal play, this action centers the through-hole 22 to be tested by moving the entire board 20 a slight amount. After this, the lower solenoid 82 is actuated, bringing the lower probe 74 into contact with the lower end of the through-hole 22. Because there is a small amount of horizontal play, the lower probe 74 self-adjusts for optimum placement, and there is good contact of all three lower probe edges, and a minimum of contact resistance. Further, this is accomplished with only minimal vertical force by the probes 54, 74.

Because each of the probes 54 and 74 contacts the plating 106 at only three points, the contact pressure is not distributed over the entire circular edge of the plating 106. Consequently, a good electrical contact can be made at relatively low pressure, and no damage to the plating 106 ensues from the use of the probes 54 and 74.

It has been discovered that there is a sufficient distribution of current over the through-hole for accurate measurement of voltage if even a light pressure is applied to the probes, that is, pressure on the order of several ounces or less. This is true because the force is concentrated near the probe tip edges. As a result, the probes do not squeeze the plating 106, and do not flare it out or crush or damage the plating 106.

FIG. 9 shows in a simple, schematic way, the current paths over the plating 106 and voltage measurement across it in a test of a through-hole in which the probes 54 and 74 are employed. The probe 54 touches the upper edge of the plating 106 at three discrete points a, b, and c, and the lower probe 74 touches the lower edge of the plating 106 at three corresponding discrete points 1, 2, and 3. The three probe elements 82, 84, 86 of the upper probe 54 are isolated from each other and can be switchably connected to a current source or to a voltage measuring device. Similarly, the corresponding members of the lower probe 74 are isolated from each other and can be coupled to corresponding terminals of the voltage source or current measuring device.

Current I can be applied between the aligned contact points, such as b and 2, as shown in the single dot chain line, or between non-aligned contact points, such as b and 3, as illustrated in the two-dot chain line. Of course, the current that is injected into the plating 106 does not necessarily take a direct-line path from the upper probe 54 to the lower probe 74, and the actual current pattern depends on many factors, such as the uniformity of the plating. The voltage drop V across the plating 106 of the through-hole 22 is measured between two of the aligned probe edges, here illustrated by the contact points a and 1, and shown as a dash line.

Typically, three measurements are taken at each through-hole 22, with the current applied alternately to three paths, i.e., b-3, c-1, a-2, and with three corresponding alternate voltage drops being taken, that is, a-1, b-2, and c-3. Then, the average voltage drop V is divided by the current I applied to the plating 106 and this yields an average resistance of the through-hole plating 106.

If the plated through-holes 22 of a given circuit board all have an average plating resistance within a predetermined tolerance (i.e., plus or minus 2%), the platings can be assumed to be sound and the circuit board passes inspection. However, if one or more of the through-holes 22 has an average resistance outside the tolerance range, for example, plus or minus 7%, the faulty through-hole or holes can be identified, and appropriate action taken with respect to the printed circuit board 20.

Figure 10:
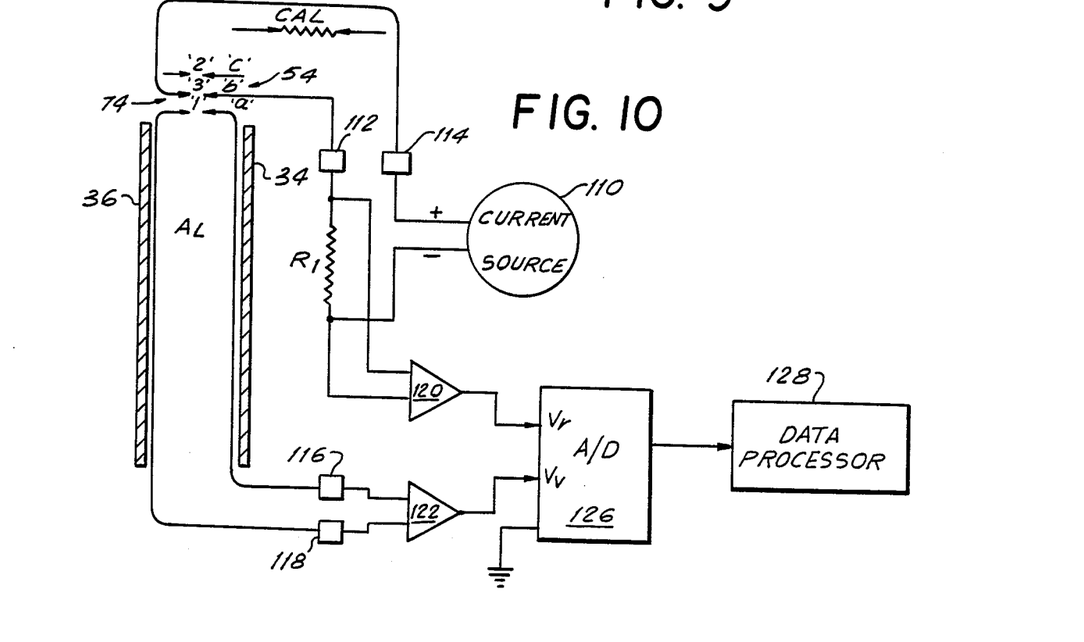
FIG. 10 is a simplified circuit drawing illustrating the principles of the apparatus of this invention.

FIG. 10 is a simplified schematic diagram illustrating the overall circuit arrangement and some of the advantages of the apparatus of this invention. As shown in FIG. 10, a current source 110 is coupled through switching circuitry 112, 114, to a respective longitudinal member of each of the probes 54 and 74. In this instance, the current source 110 is coupled to those members corresponding to contact points b and 3 of the probes 54 and 74, respectively. A small value resistor $R_1$ is also interposed in series in this circuit. Additional circuits can selectively connect a calibration load CAL, here schematically shown as a resistance.

Connecting circuitry 116 and 118 have inputs coupled to respective contact points a and 1 of the probes 54 and 74, respectively. The conductors from the voltage-measuring contact a and 1 to the switching circuitry 116 and 118 defines a circuit loop of finite size, that is, a loop having an area $A_L$, as illustratively shaded in FIG. 10.

A differential amplifier 120 has inputs coupled to either side of the small-value resistor $R_1$, and an output providing a value $V_i$ representing the current through the resistor $R_1$. Another operational amplifier 122 has inputs coupled to outputs of the switching circuitry 116 and 118, and an output providing a value $V_v$ representing the voltage across the plating 106 of the through-hole 22. These values $V_v$ and $V_i$ are provided to inputs of a suitable analog to digital converter 126. These values are digitized and fed to an input of a data processor 128, e.g., a suitably programmed computer. The latter produces an output indicating the quality of the through-hole plating 106.

The converter 126 is preferably a dual-slope integrating analog to digital converter, and this is used because of its superior rejection of line-frequency hum (i.e., 50 Hz, 60 Hz, or 400 Hz hum).

As mentioned previously, the area $A_L$ of the voltage loop should be maintained as small as feasible so that the amount of stray magnetic flux traversing the loop is kept to a minimum. In order to effect this, the loop is made as narrow as possible by running the leads from the probe contact points a and 1 in close proximity to the spacing 18. In addition, any stray magnetic flux is diverted to the outside of the loop, to the maximum extent possible, by providing a shield of a ferromagnetic substance disposed outside the loop. In the preferred embodiment, this is accomplished by disposing the ferromagnetic channel members 34 and 36 above and below the cable runs 38 and 40, respectively. The aluminum of the housing members 12 and 14 is actually somewhat diamagnetic. Thus, the walls of the housing members disposed adjacent the separation 18 additionally serve to decrease the amount of flux passing through the loop area $A_L$.

The combination of these features, namely, making the loop area $A_L$ as small as possible, placing the ferromagnetic channel members 34 and 36 adjacent to, but outside the loop, and using a dual-slope integrating converter 126, prevents any stray voltages or noise, generated from fluctuating external magnetic fields, from dominating the voltage sensed by the probe contact points a and 1.

Figure 11:
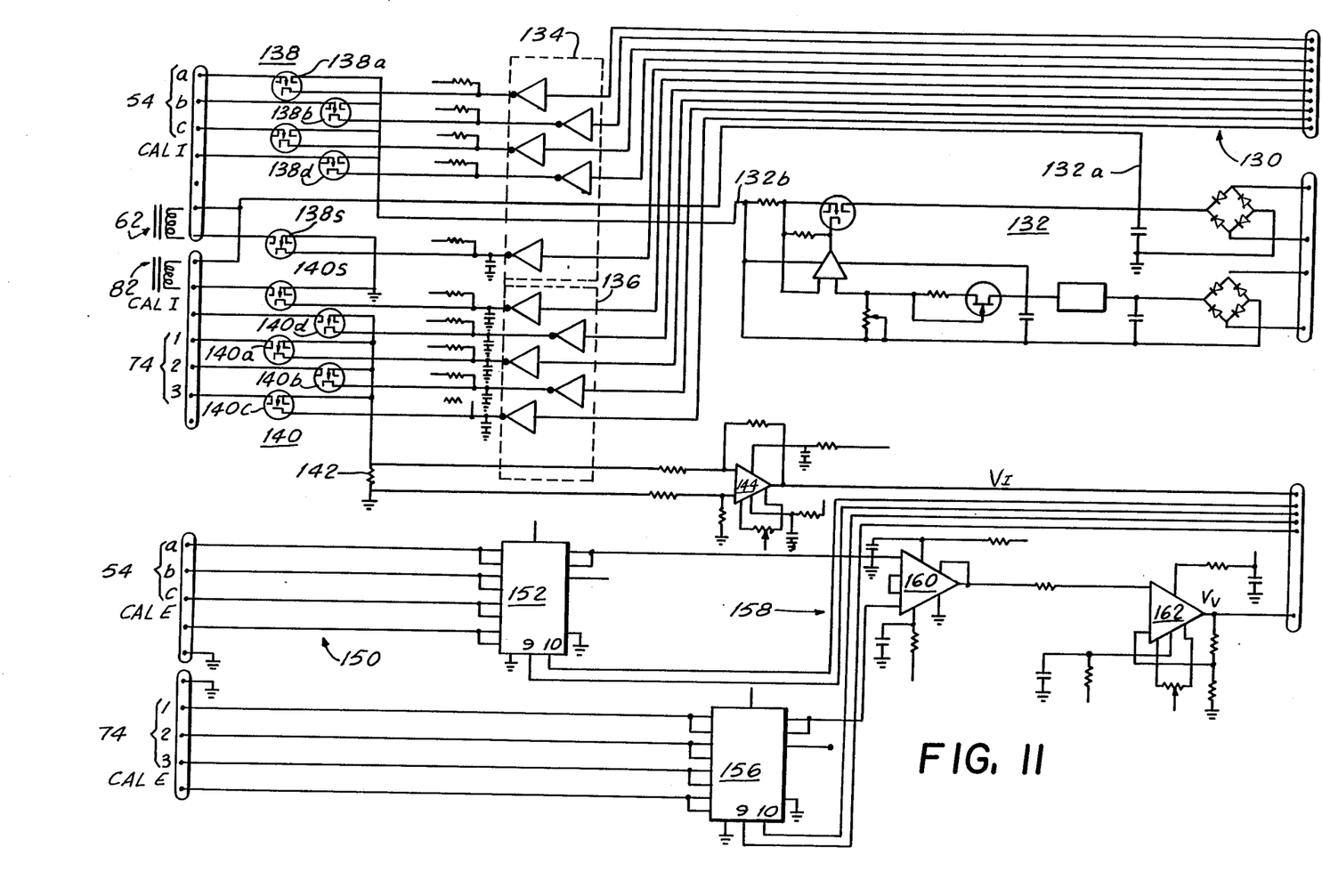
FIG. 11 is a detailed circuit diagram of the principal electronics components of the apparatus of FIG. 1.

FIG. 11 illustrates the details of a specific circuit arrangement employed in the preferred embodiment shown in FIG. 1. Here, the circuitry 48 includes a control bus 130 having a plurality of control leads for carrying externally-generated control signals. A regulated DC current supply 132 has a pair of outputs 132a and 132b. The output 132a provides ripple-less DC power to operate the solenoids 62 and 82, and the output 132b provides a regulated current of approximately 200 ma to be fed to the probes 54 and 74.

The leads of the control bus 130 are coupled through inverters of an upper inverter bank 134 and a lower inverter bank 136 to respective control inputs of an upper bank 138 and lower bank 140 of VMOS switching transistors.

In the upper bank 138, the current supply output 132b is coupled by respective switching transistors 138a, 138b, 138c and 138d to the contact points a, b, and c of the upper probe 54, and to a calibration load Cal I, respectively. A solenoid-control transistor 138s grounds one side of the solenoid 62, the other side of which is supplied from the current output 132a. Similarly, in the lower bank 140, current is drained to ground from the contact points 1, 2, 3 of the probe 74 and from the calibration load Cal I through the transistors 140a, 140b, 140c, and 140d, respectively. Energization current is fed from the current output 132a to the solenoid 82, and thence to ground through a solenoid-control transistor 140s.

A low-value resistor 142 is interposed between the transistors 140a-140d and ground, and the voltage across this resistor 142 is supplied to inputs of a differential amplifier 144. The latter supplies a current value $V_I$ to an output terminal. This operational amplifier 144 can favorably be arranged as a linear amplifier with a gain on the order of fifty. A plurality of voltage leads 150 couple the contact terminals a, b, c of the upper probe and the calibration load Cal E to an analog switch integrated circuit 152. Similarly, a plurality of voltage leads 154 couple the contact points 1, 2, 3 of the lower probe 74 and the calibration load Cal E to another analog switch 156 of similar configuration. In this embodiment, these analog switches 152 and 156 are constituted by type 4052 integrated circuits. As shown, these circuits 152 and 156 have input leads, identified by pin numbers 9 and 10, as control inputs. A voltage control bus 158 has leads coupled to pins 9 and 10 of both analog switches 152 and 156. The particular voltage-sensing contact points of the probes 54 and 74 is selected by providing a two-digit signal to the control pins of these analog switches 152 and 156. Outputs of the switching circuits 152 and 156 are coupled to inputs of an operational amplifier 160, arranged as a differential amplifier, and having an output that is supplied to a further operational amplifier 162 whose output provides an output voltage value $V_v$. The tandem operational amplifiers 160 and 162 preferably are set at maximum gain of about 20,000.

Control signals applied to the control bus 158 select the particular voltage contacts of the probes 54 and 74 or the calibration load Cal E, as generally shown in the following table.

TABLE

|  | Probe 54 | Probe 74 |
|---|---|---|
| "00" | a | 1 |
| "01" | b | 2 |
| "10" | c | 3 |
| "11" | Cal E | Cal E |

The voltage value $V_v$ and the current value $V_I$ are favorably fed to an analog-digital converter, such as the converter 126 of FIG. 10. This converter circuit then provides a digital signal which can be processed in a suitably programmed general purpose computer. The latter can automatically control the switching circuitry 138a–138c, 140a–140c, 152 and 156 via the control bus 158; process the data corresponding to the current and voltage values $V_I$ and $V_v$, and produce output data about the quality of the plated through-hole 22.

Favorably, all controls, except for the actuation of the solenoids 62 and 82, are generated by an algorithm in the general purpose computer. Thus, once the test is commenced, the feeding of current, measuring of voltage, and analysis of the data are all carried out substantially automatically. In most cases, this entire process takes a relatively short time, on the order of one second.

Although a particular embodiment of this invention has been shown and described hereinabove, it should be recognized that the principles of this invention can be carried out in many alternative ways. For example, the probes 54 and 58 an be provided with somewhat rounded faces on the point, so long as the faces meet to define a definite edge. Also, the apparatus can employ alternating current, rather than direct current, for testing the through-hole plating 106, if suitable adjustment is made in the construction and placement of the circuitry 48.

Also, terms of orientation, such as "upper" and "lower", as used in the specification and claims, serve to facilitate the description of the illustrated embodiment. However, the present invention is not limited to structure oriented in any one particular fashion.

While a particular embodiment has been described, it should be apparent to those of ordinary skill that many modifications and variations thereof are possible without departure from the scope and spirit of this invention, as defined in the appended claims.

I claim:

1. An electrical non-destructive testing probe for electrically testing a conductive plating of an appropriately sized through-hole in a printed circuit board, said conductive plating having a conductive interior rim, said probe comprising
   a conductive tip portion, said tip portion including at least three conductive members, each of said conductive members including only one exteriorly projecting sloping contact edge extending generally towards an apex; the sloping contact edge on each of said conductive members being substantially equally spaced apart from the other single sloping contact edges such that when the conductive tip portion is brought into contact with the conductive plating to be tested, each of said sloping contact edges will contact said conductive interior rim at a single substantially discrete point on said conductive interior rim, said substantially discrete points mutually substantially equally spaced apart from each other around the rim; means for joining said sloping contact edges together and electrically insulating all of said sloping contact edges from each other disposed between successive ones of said sloping contact edges so that all of said edges are joined together and electrically isolated from one another; and means for electrically connecting said edges to respective terminals of a measurement device.

2. A probe as defined in claim 1 wherein said sloping contact edges are rounded.

3. Testing apparatus for use in the measurement of conductivity of a conductive plating on a through-hole in a printed circuit board, the plating having peripheries on opposed sides of the printed circuit board, comprising
   means for applying an electric current between one of respective at least first and second points at one of the opposed peripheries of the through-hole plating and one of respective at least first and second points on the other of said peripheries, said means comprising;

contact means for making electrically conductive contact at the at least first and second points at each of the opposed peripheries of the through-hole plating, said contact means comprising an electrical non-destructive testing probe including at least two conductive members electrically insulated from one another, each of said conductive members including only a single substantially localized contact point adapted for contact at one of said points on one of said peripheries;

means for connection of each of said conductive members to a source of current;

means for producing a measurement of consistency of the conductivity of the plating of the through-hole, said means including     means for sensing a voltage between another of said at least first and second points on the one periphery and another of said at least first and second points on the other periphery, and adapted to provide a signal representative of said voltage;

means for sensing the current flowing between those of said first and second points through which the electric current is applied to the through-hole plating and adapted to provide a signal representative of said current;

electronic means permitting automatic successive selection of those of the at least first and second points to which said current is applied and those of said first and second points to which the voltage sensing means is coupled;

electronic means permitting automatic successive sensing of the voltage between said first and second point on the one periphery and another of said at least first and second points on the other periphery and for sensing of the current flowing between those of said first and second points through which the electric current is applied to the through-hole plating.

4. Testing apparatus according to claim 3, in which said first and second points are discrete points of contact.

5. Testing apparatus according to claim 3, wherein the probe has three conductive members.

* * * * *